United States Patent
Tsunoda et al.

(10) Patent No.: US 8,164,385 B2
(45) Date of Patent: Apr. 24, 2012

(54) AMPLIFIER CIRCUIT

(75) Inventors: Yukito Tsunoda, Kawasaki (JP); Mariko Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/547,625

(22) Filed: Aug. 26, 2009

(65) Prior Publication Data

US 2010/0052790 A1    Mar. 4, 2010

(30) Foreign Application Priority Data

Aug. 28, 2008    (JP) ................. 2008-220000

(51) Int. Cl.
*H03F 3/45*    (2006.01)

(52) U.S. Cl. .......................... 330/260; 330/98
(58) Field of Classification Search .............. 330/260, 330/310, 98, 150
See application file for complete search history.

(56) References Cited

U.S. PATENT DOCUMENTS

| | | | |
|---|---|---|---|
| 5,045,807 A * | 9/1991 | Ishihara et al. | 330/260 |
| 5,337,010 A | 8/1994 | Nishiyama | |
| 5,568,089 A | 10/1996 | Maru | |
| 6,630,861 B2 * | 10/2003 | Kawaoka | 330/133 |
| 6,919,762 B2 | 7/2005 | Akamine et al. | |
| 7,605,650 B2 * | 10/2009 | Forbes | 330/109 |

FOREIGN PATENT DOCUMENTS

| | | |
|---|---|---|
| JP | H04-145711 | 5/1992 |
| JP | H05-218755 | 8/1993 |
| JP | H07-007340 | 1/1995 |
| JP | H08-256024 | 10/1996 |
| JP | H10-247831 | 9/1998 |
| JP | 2004-193846 | 7/2004 |

\* cited by examiner

*Primary Examiner* — Henry Choe
(74) *Attorney, Agent, or Firm* — Fujitsu Patent Center

(57) ABSTRACT

An amplifier circuit includes a first amplifier amplifying an input signal and outputting a first amplified signal, a second amplifier amplifying the first amplified signal and outputting a second amplified signal, and a feedback circuitry feeding back the second amplified signal to the input of the second amplifier. The feedback circuitry includes a feedback transistor that keeps the input level of the second amplifier constant.

3 Claims, 8 Drawing Sheets

AMPLIFIER CIRCUIT

CROSS-REFERENCE TO RELATED APPLICATION(S)

The application is based upon and claims the benefit of priority of the prior Japanese Patent Application No. 2008-220000, filed on Aug. 28, 2008, the entire contents of which are incorporated herein by reference.

FIELD

The present invention relates to an amplifier circuit and may be used in a high-speed optical communication apparatus or the like.

BACKGROUND

In recent years, the amount of communication has been ever-increasing due to popularization of broadband networks, such as the Internet, and establishment of a large-capacity photonic network has been demanded accordingly. Under the present circumstances, a network at a communication speed of 10 Gbps is in the mainstream. Development of transmitters including an optical modulator and receivers adaptable to a communication speed to 40 Gbps has been demanded to cope with a further increase in the amount of communication. In order to modulate an optical signal of 40 Gbps, an optical modulator of LiNbO3 (LN modulator) is used, for example. Driving the LN modulator at 40 Gbps requires an amplifier circuit capable of a high-speed and large-amplitude modulated output.

FIG. 7 illustrates a two-stage feedback amplifier circuit according to a related art. In FIG. 7, the two-stage feedback amplifier circuit 70 includes an amplifier circuit of a two-stage configuration, in which an output of a second-stage amplifier is fed back to a bias of a first-stage amplifier. That is, electric signals including modulation information input to "IN" and "IN" (negative logic) are amplified by corresponding two stages of transistors T1 and T2 and T3 and T4, respectively, and are output from output terminals "OUT". The output of the transistor T2 is fed back to the bias of the transistor T1, which is a first-stage amplifier, whereas the output of the transistor T4 is fed back to the bias of the transistor T3, which is a first-stage amplifier. Accordingly, an amplification gain of a high-frequency component increases.

That is, a feedback current from the output of the transistor T2 flows through resistors R2 and R3 and is fed back to the bias of the transistor T1. Likewise, a feedback current from the output of the transistor T4 flows through resistors R5 and R6 and is fed back to the bias of the transistor T3. The configuration enables an increase in amplification gain of a high-frequency component and a broader amplification band.

FIG. 8 illustrates a configuration of a two-stage feedback amplifier circuit according to a related art. In the two-stage feedback amplifier circuit 80 illustrated in FIG. 8, source follower transistors T5 and T6 are connected between resistors R2 and R3 and between resistors R5 and R6, respectively. A feedback current from an output of a transistor T2 is supplied to a bias of a transistor T1, which is a first-stage amplifier, via the transistor T5. A feedback current from an output of a transistor T4 is supplied to a bias of a transistor T3, which is a first-stage amplifier, via the transistor T6.

The following configuration of a multistage high-frequency power amplifier circuit including a plurality of cascaded power amplifying transistors has been known and disclosed in Japanese Unexamined Patent Application Publication No. 2004-193846, for example. That is, in the configuration, distortion of a signal is reduced by allowing a sufficient idle current to flow to an amplifying transistor before the last stage even in a region of a low output power level, thereby enhancing power efficiency.

Also, a related art of an amplifier circuit to suppress an influence of feedback capacitance and to realize a broad band at low cost is described in Japanese Unexamined Patent Application Publication No. 08-256024. Also, there is known an amplifier circuit including total-feedback amplifier circuits and level-shift amplifier circuits alternately connected in multi-stages. In the amplifier circuit, a capacitance component provided between transistors of the level-shift amplifier circuit suppresses emitter negative feedback resistance in high frequencies, increases the gain of high frequencies, and realizes a broader bandwidth. Such an amplifier circuit is disclosed in Japanese Unexamined Patent Application Publication No. 10-247831, for example.

In the case where the two-stage feedback amplifier circuit illustrated in FIG. 7 or 8 is used as a driver of an LN optical modulator of a high-speed optical communication apparatus on a transmission side, a signal level necessary to drive the optical modulator is obtained by adjusting the amount of current flown to a current source I. That is, when the LN optical modulator is connected to the output terminals "OUT" and the amplifier circuit is used as a driver of the LN optical modulator, an output amplitude of the driver depends on the amount of current flowing in the current source I, and thus the output amplitude is adjusted by adjusting the amount of current, whereby an output level necessary to drive the optical modulator used is obtained.

However, if the amount of current flowing in the current source I is changed in the amplifier circuit illustrated in FIG. 7 or 8, the potentials at respective points A, B, and C illustrated in FIGS. 7 and 8 change at the same time. Particularly, the potential at point C corresponds to a gate potential of the transistor T2, which is a second-stage amplifier. An abnormal operation of the transistor T2 occurs due to a change in potential level at point C, and as a result an output waveform significantly degrades. This is the same in the gate potential on the transistor T4 side.

SUMMARY

An amplifier circuit includes a first amplifier amplifying an input signal and outputting a first amplified signal, a second amplifier amplifying the first amplified signal and outputting a second amplified signal, and a feedback circuitry feeding back the second amplified signal to the input of the second amplifier. The feedback circuitry includes a feedback transistor that keeps the input level of the second amplifier constant.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A and 2B illustrate waveforms of output signals when the amplifier circuit according to the first embodiment is used, wherein FIG. 2A illustrates a waveform of an output signal when an output amplitude is set to 4 Vp-p, whereas FIG. 2B illustrates a waveform of an output signal when an output amplitude is set to 2 Vp-p;

FIGS. 3A and 3B illustrate waveforms of output signals in a conventional circuit, wherein FIG. 3A illustrates a waveform of an output signal when an output amplitude is set to 4 Vp-p whereas FIG. 3B illustrates a waveform of an output signal when an output amplitude is set to 2 Vp-p;

DESCRIPTION OF THE PREFERRED EMBODIMENTS

Figure 1:
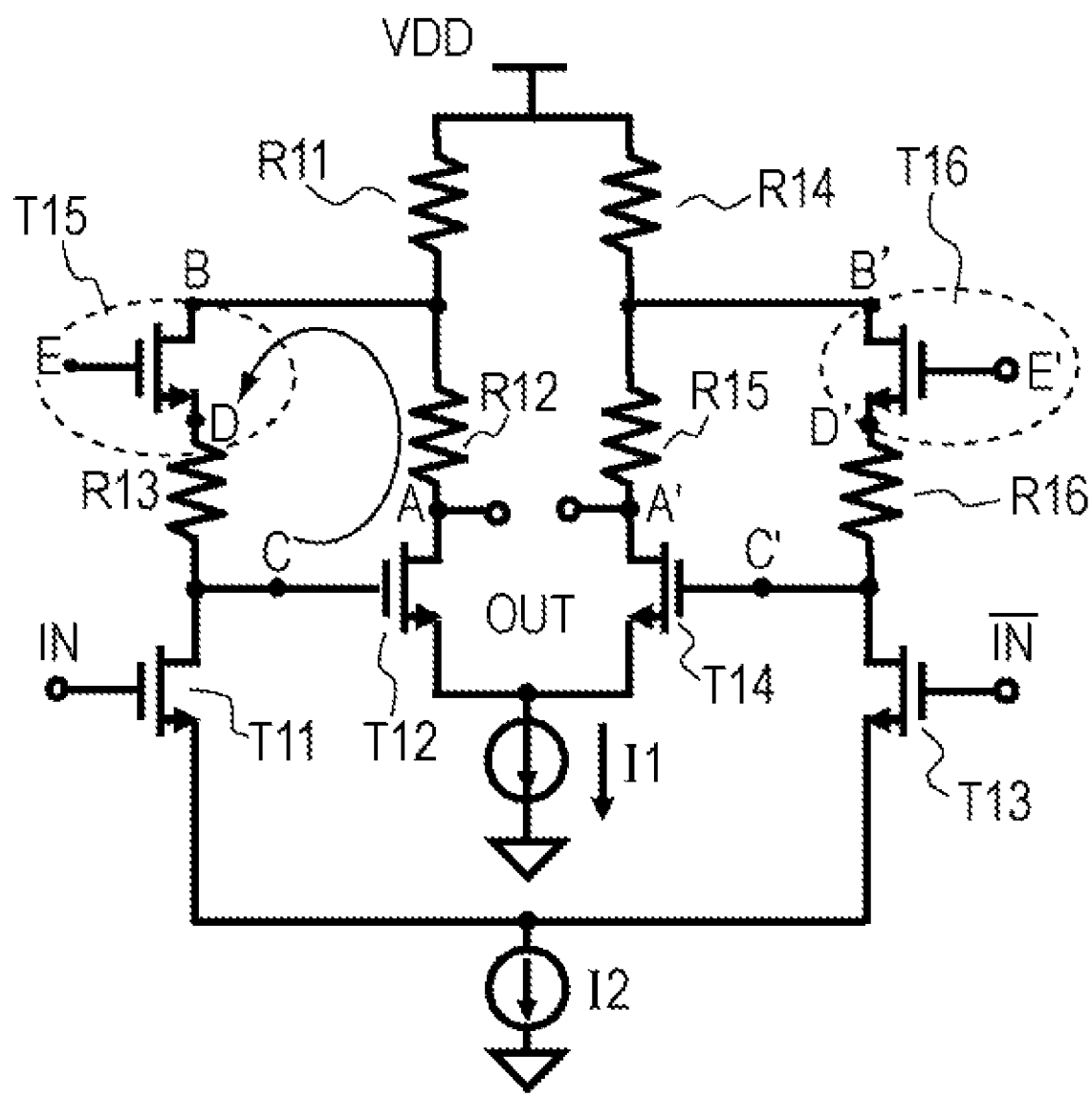
FIG. 1 illustrates an amplifier circuit according to a first embodiment.

Reference will now be made in detail to the embodiments, examples of which are illustrated in the accompanying drawings, wherein like reference numerals refer to the like elements throughout. The embodiments are described below to explain the present invention by referring to the figures.

FIG. 1 illustrates an amplifier circuit according to a first embodiment. In FIG. 1, the amplifier circuit of the first embodiment includes transistors T11 to T16, resistors R11 to R16, and current sources I1 and I2. Here, the transistors T11 and T12 the transistors T13 and T14 function as a two-stage amplifier circuit. The transistors T11 and T12 amplify a signal (modulation signal) input from an input terminal "IN" and output a signal generated at a drain (point A) of the transistor T12 as an output signal of specific amplitude from a terminal "OUT". Likewise, the transistors T13 and T14 amplify a signal (modulation signal) input from an input terminal "IN" (negative logic) and output a signal generated at a drain (point A') of the transistor T14 as an output signal of specific amplitude from a terminal "OUT".

Those outputs are supplied to an LN optical modulator (not illustrated), the LN optical modulator modulates laser light in accordance with the output signals (amplitude modulated output) supplied from the above-described terminals (OUT), and transmits the modulated light to a receiver through an optical fiber cable and a repeater (not illustrated).

A bias voltage is applied to a drain of the transistor T11, which is a first-stage amplifier, via the resistor R13, and also a bias voltage is applied to a drain of the transistor T13 via the resistor R16. Likewise, a bias voltage is applied to the drain of the transistor T12, which is a second-stage amplifier, via the resistor R12, and also a bias voltage is applied to the drain of the transistor T14 via the resistor R15. The resistors R11 and R14 are voltage-dividing resistors. The potential at point B is determined by set values (resistance values) of the resistors R11 and R12, whereas the potential at point B' is determined by set values (resistance values) of the resistors R14 and R15.

In FIG. 1, the transistor T15 is connected between point B and one end of the resistor R13 (point D). Specifically, one end of the resistor R13 (point D) connects to a source of the transistor T15, and a drain of the transistor T15 connects to a junction point between the resistors R11 and R12 (point B). A gate voltage (described below) is applied to a gate of the transistor T15 (point E).

Likewise, one end of the resistor R16 (point D') connects to a source of the transistor T16, and a drain of the transistor T16 connects to a junction point between the resistors R14 and R15 (point B'). A gate voltage (described below) is applied to a gate of the transistor T16 (point E').

Also, the amplifier circuit according to the first embodiment illustrated in FIG. 1 is supplied with power VDD. A current flowing through the resistors R11 and R12 and the transistor T12 (and the resistors R14 and R15 and the transistor T14) flows in the current source I1, whereas a current flowing through the resistor R11, the transistor T15, the resistor R13, and the transistor T11 (and the resistor R14, the transistor T16, the resistor R16, and the transistor T13) flows in the current source I2.

In the above-described configuration, when signals are supplied from "IN" and "IN" (negative logic), the signals are amplified by the corresponding two stages of amplifiers (the transistors T11 and T12 and the transistors T13 and T14), and a differential output of the both signals is supplied from the terminals "OUT" to the above-described LN optical modulator. The current source I1 is adjusted to specific current value so that an amplitude modulated output corresponding to the optical modulator may be obtained. For example, the adjustment is performed in a range from 40 mA to 160 mA.

At the time, the potential levels at points B and B' change, as described above in relation to the related arts. That is, the resistance values of the resistors R11, R12, R14, and R15 are fixed, but a reference current value changes, so that the potential levels at points B and B' change. In the first embodiment, however, unlike in the related arts, the transistor T15 is placed between point B and point D and also the transistor T16 is placed between point B' and point D'. With the configuration, even when the potential levels at points B and B' change, the potential levels at points D and D' are kept.

Therefore, a gate signal E is applied to the gate of the transistor T15, whereby change of the potential level at point D is prevented. Likewise, a gate signal E' is applied to the gate of the transistor T16, whereby change of the potential level at point D' is prevented. With the configuration, the potential levels at points C and C' are kept. Accordingly, the transistors T12 and T14 in output stages may be normally driven without affecting the gate voltages of the transistors T12 and T14, which are second-stage amplifiers, so that an output at an amplitude level corresponding to the optical modulator may be supplied to the optical modulator.

The gate signals E and E' applied to the gates of the transistors T15 and T16 may set the potential levels at points D and D', calculated by the following expressions.

Voltage($D$)=potential at point $C$+(resistance value of $R13$×(current value of current source $I2/2$))

Voltage($D'$)=potential at point $C'$+(resistance value of $R16$×(current value of current source $I2/2$))

Therefore, the amplifiers in the last stages may be normally operated and a normal drive signal may be supplied to the optical modulator without affecting the potential levels at points D and D' by supplying gate signals satisfying the above-described condition to the gates of the transistors T15 and T16, even when the current value of the current source I1 is adjusted.

Figure 2A:
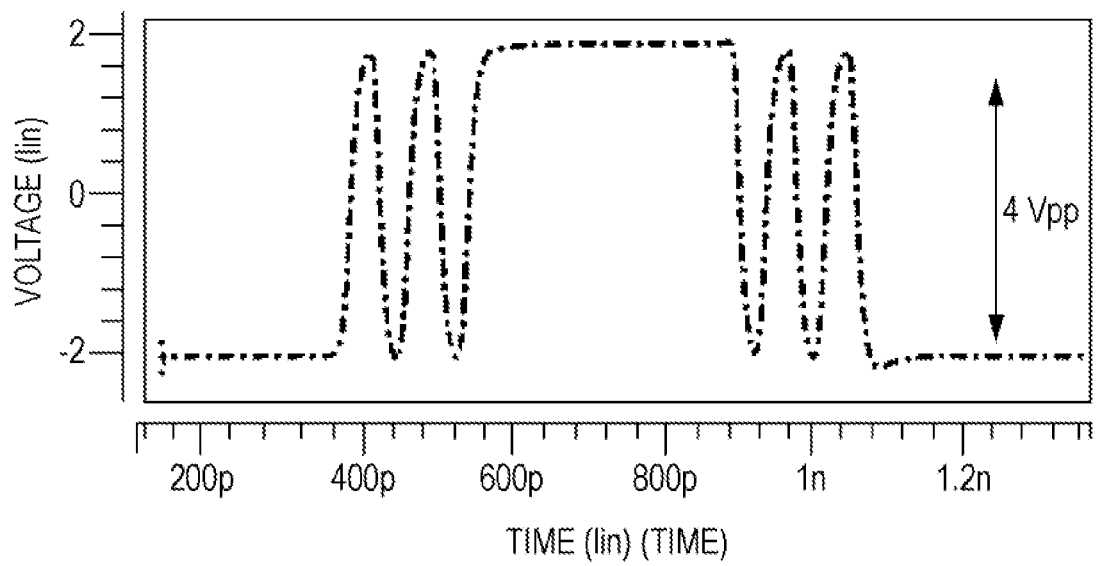
Figure 2B:
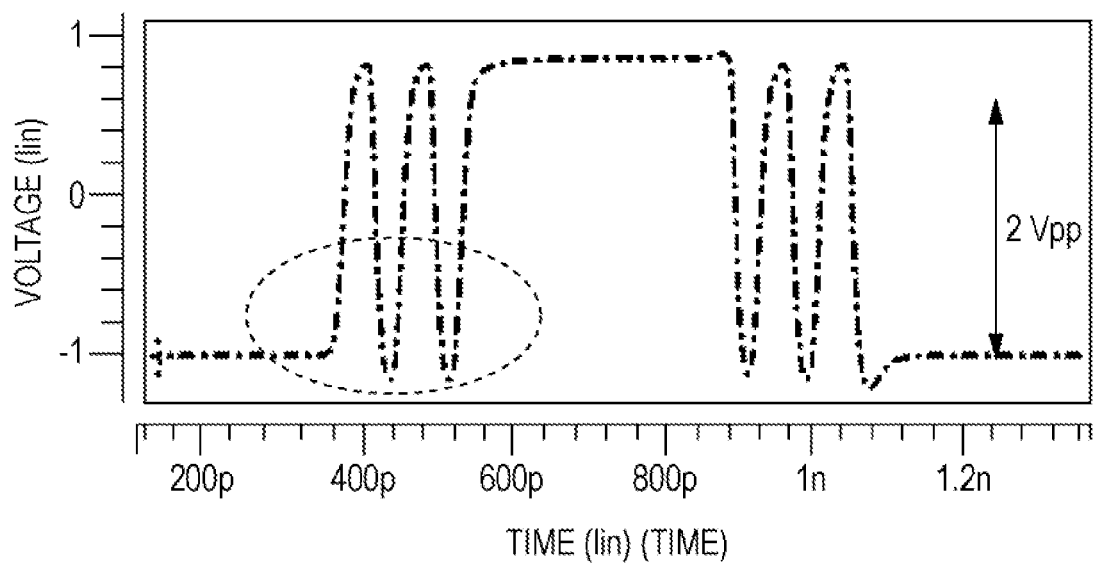

FIGS. 2A and 2B illustrate waveforms of output signals when the amplifier circuit illustrated in FIG. 1 is used. FIG. 2A illustrates a waveform of an output signal when an output amplitude is set to 4 Vp-p, whereas FIG. 2B illustrates a waveform of an output signal when an output amplitude is set to 2 Vp-p. In the first embodiment, as illustrated in FIGS. 2A and 2B, the waveform of the output signal does not change even when the current source I1 is adjusted and when the output amplitude is adjusted from 4 Vp-p to 2 Vp-p, so that the transistors T12 and T14 in the output stages are normally driven and that a favorable signal waveform may be supplied to the optical modulator.

Figure 3A:
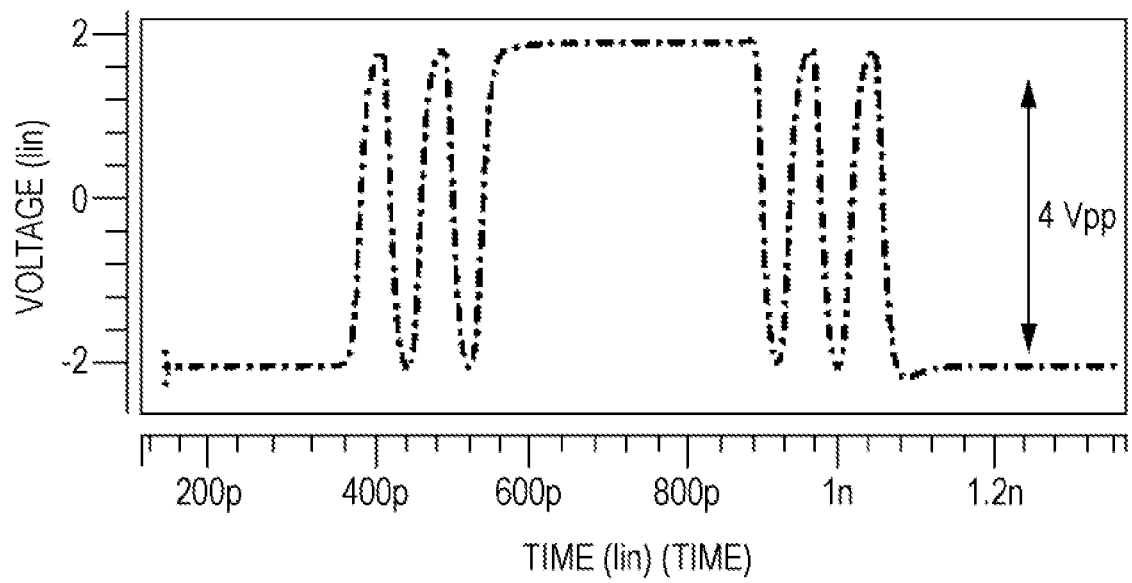
Figure 3B:
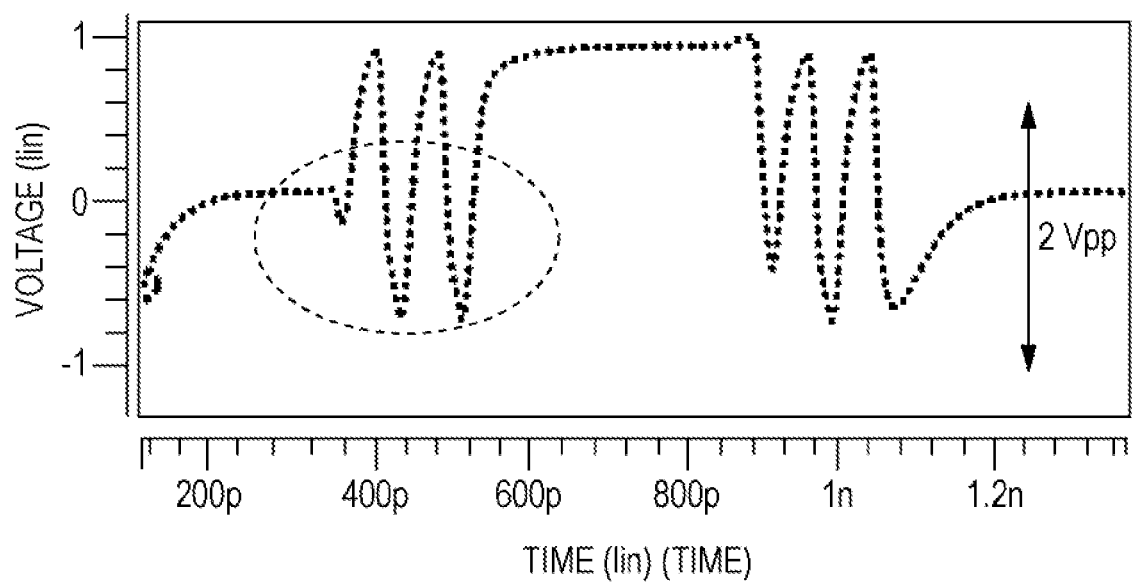

FIGS. 3A and 3B are for comparison with the waveforms in the above-described embodiment and illustrate waveforms of output signals in a conventional circuit. As can be understood, the waveform at the output amplitude set to 2 Vp-p illustrated in FIG. 3B is significantly degraded compared to the waveform at the output amplitude set to 4 Vp-p illustrated in FIG. 3A.

Accordingly, as described above in the first embodiment, a normal drive signal may be supplied to the optical modulator without affecting the gate voltages of the amplifiers in the last stages by providing the transistors T15 and T16 and by applying gate signals satisfying the above-described condition to the gates of the transistors T15 and T16, even when the output amplitude is adjusted.

Figure 4:
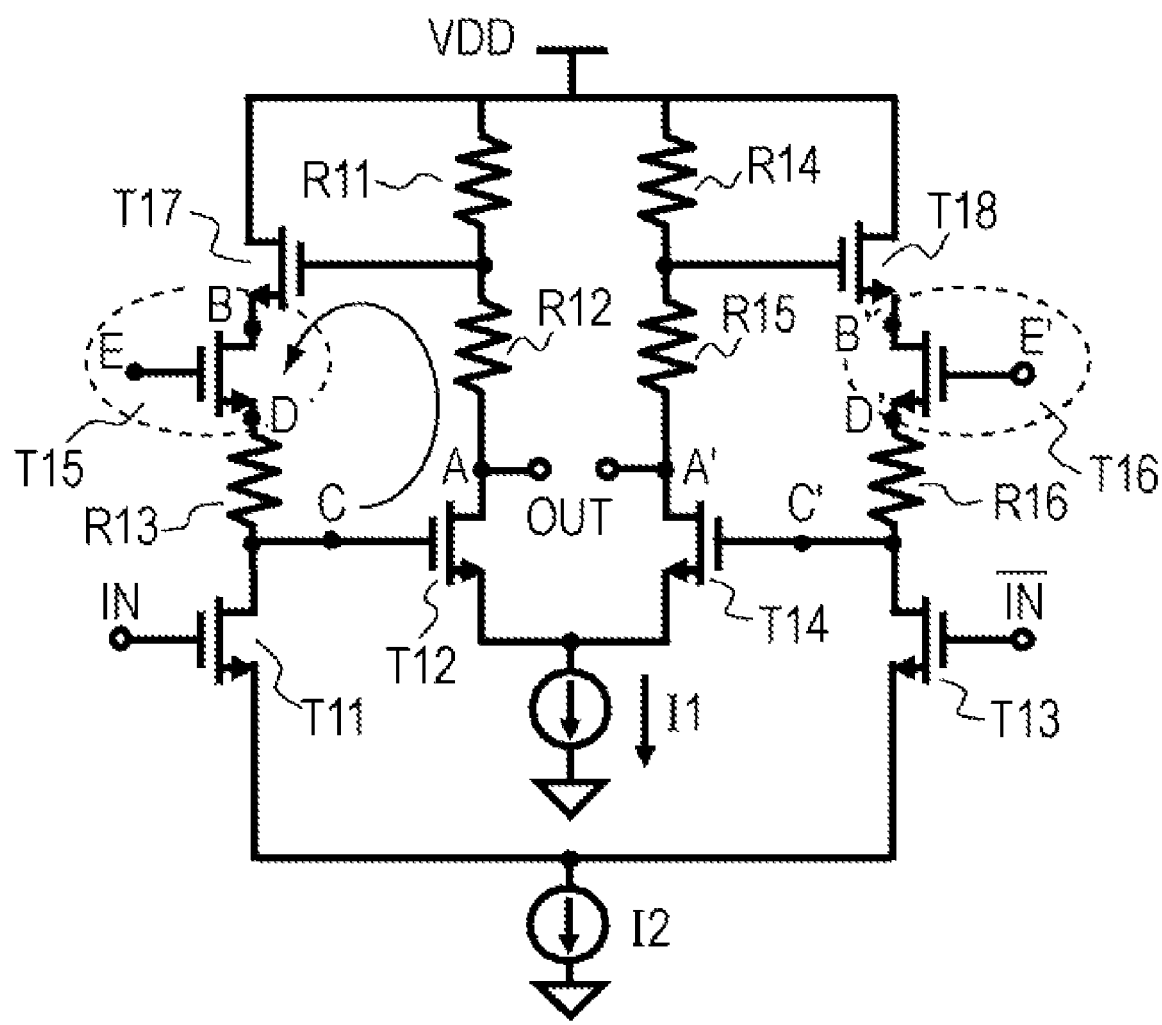
FIG. 4 illustrates an amplifier circuit according to a second embodiment.

FIG. 4 illustrates an amplifier circuit according to a second embodiment. The amplifier circuit of the second embodiment has the same configuration as that of the above-described amplifier circuit illustrated in FIG. 1 except that transistors T17 and T18 are provided. Thus, the circuit elements are the same as those in the above-described first embodiment and are denoted by the same reference numerals.

The amplifier circuit of the second embodiment includes transistors T11 to T18, resistors R11 to R16, and current sources I1 and I2. The transistors T11, T12, T13, and T14 have the same configuration as in the first embodiment, and function as a second-stage amplifier circuit. The transistors T11 and T12 amplify a signal input from an input terminal "IN" whereas the transistors T13 and T14 amplify a signal input from an input terminal "in" (negative logic), so that specific amplitude modulated output is supplied from terminals "OUT" to an LN optical modulator (not illustrated).

A bias voltage is applied to a drain of the transistor T11, which is a first-stage amplifier, via the resistor R13, and also a bias voltage is applied to a drain of the transistor T13 via the resistor R16.

In the second embodiment, there is provided the source follower transistor T17, to which a potential at a junction point between the resistors R11 and R12 is applied as a gate voltage. A bias voltage is applied to the transistor T11, which is a first-stage amplifier, by driving the transistor T17. Also, there is provided the source follower transistor T18, to which a potential at a junction point between the resistors R14 and R15 is applied as a gate voltage. A bias voltage is applied to the transistor T13, which is a first-stage amplifier, by driving the transistor T18.

In the second embodiment, a drain of the transistor T15 connects to a source of the transistor T17, and a source of the transistor T15 connects to the resistor R13. Likewise, a drain of the transistor T16 connects to a source of the transistor T18, and a source of the transistor T16 connects to the resistor R16. Furthermore, specific gate signals E and E' are applied to gates of the transistors T15 and T16, as in the first embodiment.

With the configuration, when signals are supplied from "IN" and "IN" (negative logic) as in the first embodiment, the input signals are amplified by the corresponding two stages of amplifiers (the transistors T11 and T12 and the transistors T13 and T14), and a differential output of the both signals is output from the terminals "OUT" to the LN optical modulator (not illustrated). The current source I1 is adjusted to specific current value so that an amplitude-modulated output corresponding to the optical modulator may be obtained.

At this time, the potential levels at points B and B' illustrated in FIG. 4 change as in the first embodiment. That is, the resistance values of the resistors R11, R12, R14, and R15 are fixed, but the value of flowing current changes, so that the potential levels at points B and B' change. In the circuit illustrated in FIG. 4, however, the transistor T15 is placed between point B and point D and also the transistor T16 is placed between point B' and point D'. With the configuration, the potential levels at points D and D' are not affected.

That is, the gate signal E is applied to the gate of the transistor T15, whereby change of the potential level at point D is suppressed. Likewise, the gate signal E' is applied to the gate of the transistor T16, whereby change of the potential level at point D' is suppressed. With the configuration, the potential levels at points C and C' are kept, so that the transistors T12 and T14, which are second-stage amplifiers, are normally driven and that a drive signal with specific amplitude may be supplied to the optical modulator.

In the second embodiment, too, the gate signals E and E' applied to the gates of the transistors T15 and T16 may set the potential levels at points D and D', calculated by the above-described expressions.

Therefore, a normal drive signal may be supplied to the optical modulator without affecting the gate voltages of the amplifiers in the last stages by applying gate voltages satisfying the above-described condition, even when the current value of the current source I1 is adjusted.

Figure 5:
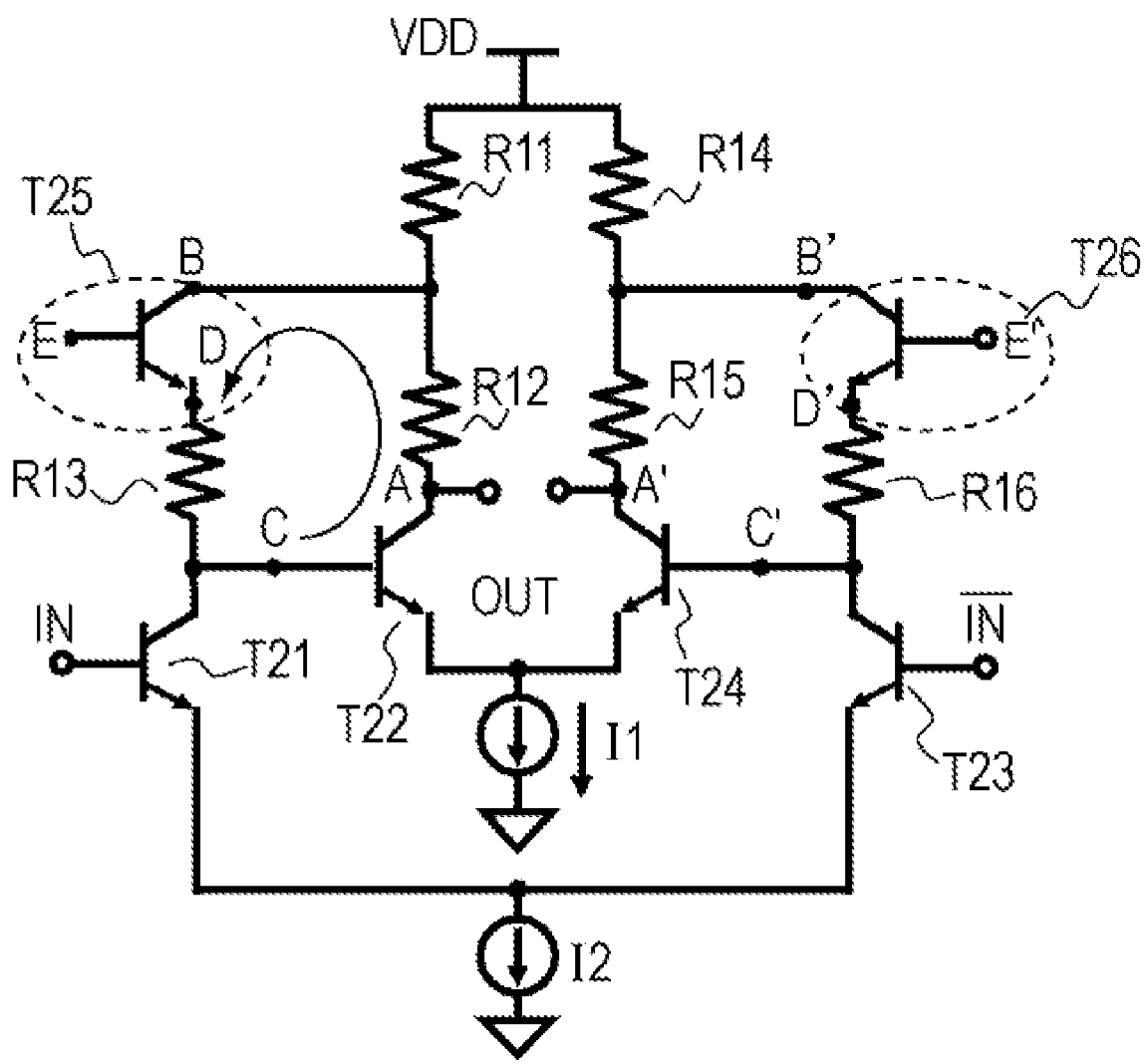
FIG. 5 illustrates an amplifier circuit according to a third embodiment.

FIG. 5 illustrates an amplifier circuit according to a third embodiment. The amplifier circuit of the third embodiment has basically the same configuration as that of the above-described amplifier circuit according to the first embodiment except that the field-effect transistors are replaced by bipolar transistors. Thus, the circuit elements are the same as those in the above-described first embodiment except the transistors are denoted by the same reference numerals.

In FIG. 5, the amplifier circuit of the third embodiment includes transistors T21 to T26, resistors R11 to R16, and current sources I1 and I2. The transistors T21 and T22 and the transistors T23 and T24 function as a two-stage amplifier circuit. The transistors T21 and T22 amplify a signal input from an input terminal "IN", and output a signal generated at a collector of the transistor T22 (point A) as an output signal of specific amplitude from a terminal "OUT". Likewise, the transistors T23 and T24 amplify a signal input from an input terminal "IN" (negative logic), and output a signal generated at a collector of the transistor T24 (point A') as an output signal of specific amplitude from a terminal "OUT".

A bias voltage is applied to a collector of the transistor T21, which is a first-stage amplifier, via the resistor R13, and also a bias voltage is applied to a collector of the transistor T23 via the resistor R16. Likewise, a bias voltage is applied to a collector of the transistor T22, which is a second-stage amplifier, via the resistor R12, and also a bias voltage is applied to a collector of the transistor T24 via the resistor R15. The resistors R11 and R14 are voltage-dividing resistors. The potential at point B is determined by set values (resistance values) of the resistors R11 and R12, whereas the potential at point B' is determined by set values (resistance values) of the resistors R14 and R15.

In the third embodiment, too, the transistor T25 is connected between point B and one end of the resistor R13 (point D). Specifically, one end of the resistor R13 (point D) connects to an emitter of the transistor T25, and a collector of the transistor T25 connects to a junction point between the resistors R11 and R12 (point B). A base voltage is applied to a base of the transistor T25.

Likewise, one end of the resistor R16 (point D') connects to an emitter of the transistor T26, and a collector of the transistor T26 connects to a junction point between the resistors R14 and R15 (point B'). A base voltage is applied to a base of the transistor T26.

In the above-described configuration, when signals are supplied from "IN" and "IN" (negative logic), the signals are amplified by the corresponding two stages of amplifiers (the transistors T21 and T22 and the transistors T23 and T24) as in the above-described embodiments, and a differential output of both signals is supplied from the terminals "OUT" to the above-described LN optical modulator. The current source I1 is adjusted to specific current value so that an amplitude modulated output corresponding to the optical modulator may be obtained.

At this time, unlike in the related arts, the transistor T25 is provided between point B and point D, and also the transistor T26 is provided between point B' and point D' in the third embodiment. Accordingly, even when the potential levels at points B and B' change, the potential levels at points D and D' are kept.

Therefore, a base voltage E is applied to the base of the transistor T25, whereby change of the potential level at point D is prevented. Likewise, a base voltage E' is applied to the base of the transistor T26, whereby change of the potential level at point D' is prevented.

With the configuration, the potential levels at points C and C' are kept, so that the transistors T22 and T24, which are second-stage amplifiers in output stages, may be normally driven and that an output at an amplitude level corresponding to the optical modulator may be supplied to the optical modulator without affecting the base voltages of the transistors T22 and T24.

In the third embodiment, too, the base voltages E and E' applied to the bases of the transistors T25 and T26 may set the potential levels at points D and D', calculated by the above-described expressions.

Figure 6:
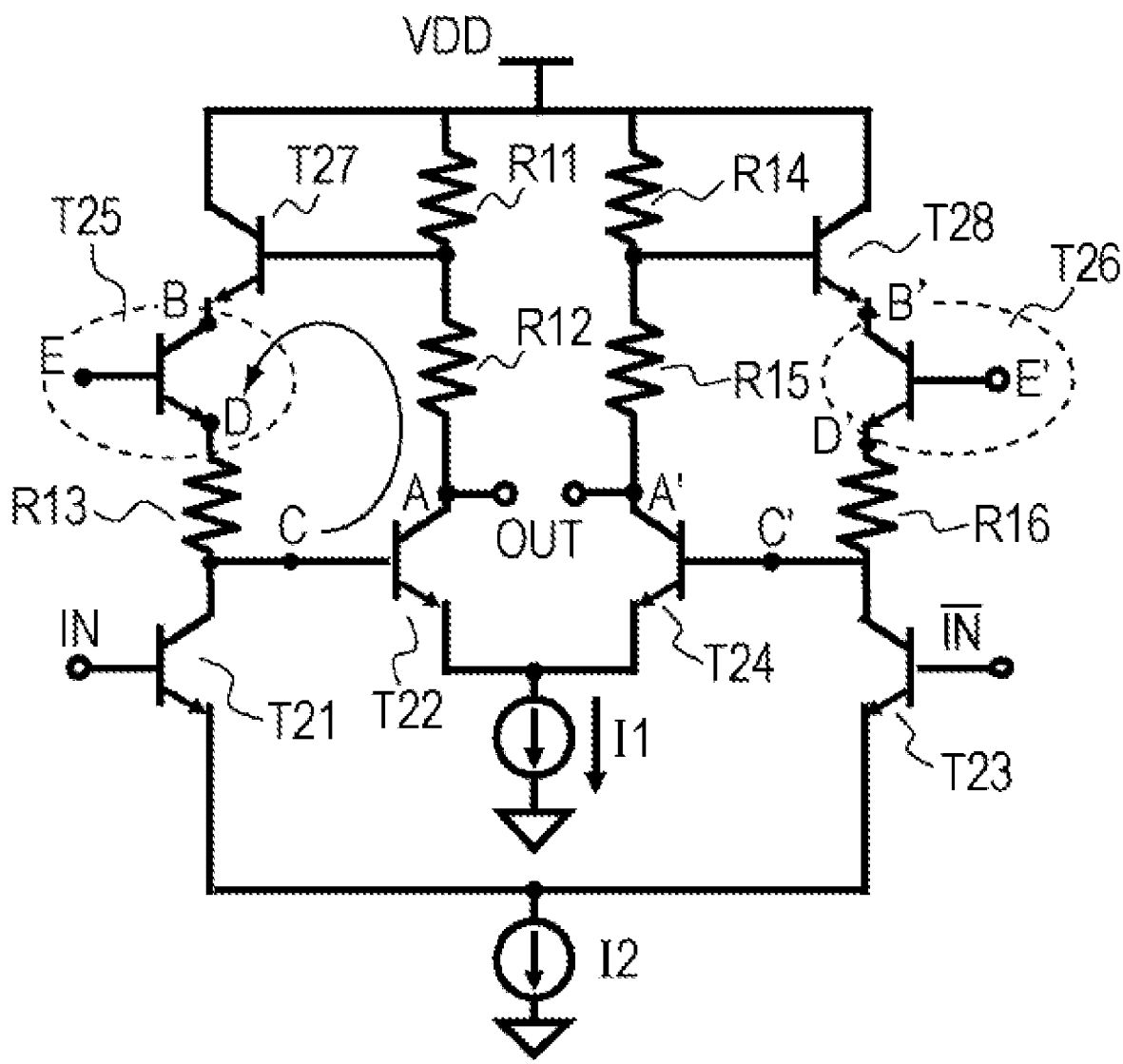
FIG. 6 illustrates an amplifier circuit according to a modification of the third embodiment.
Figure 7:
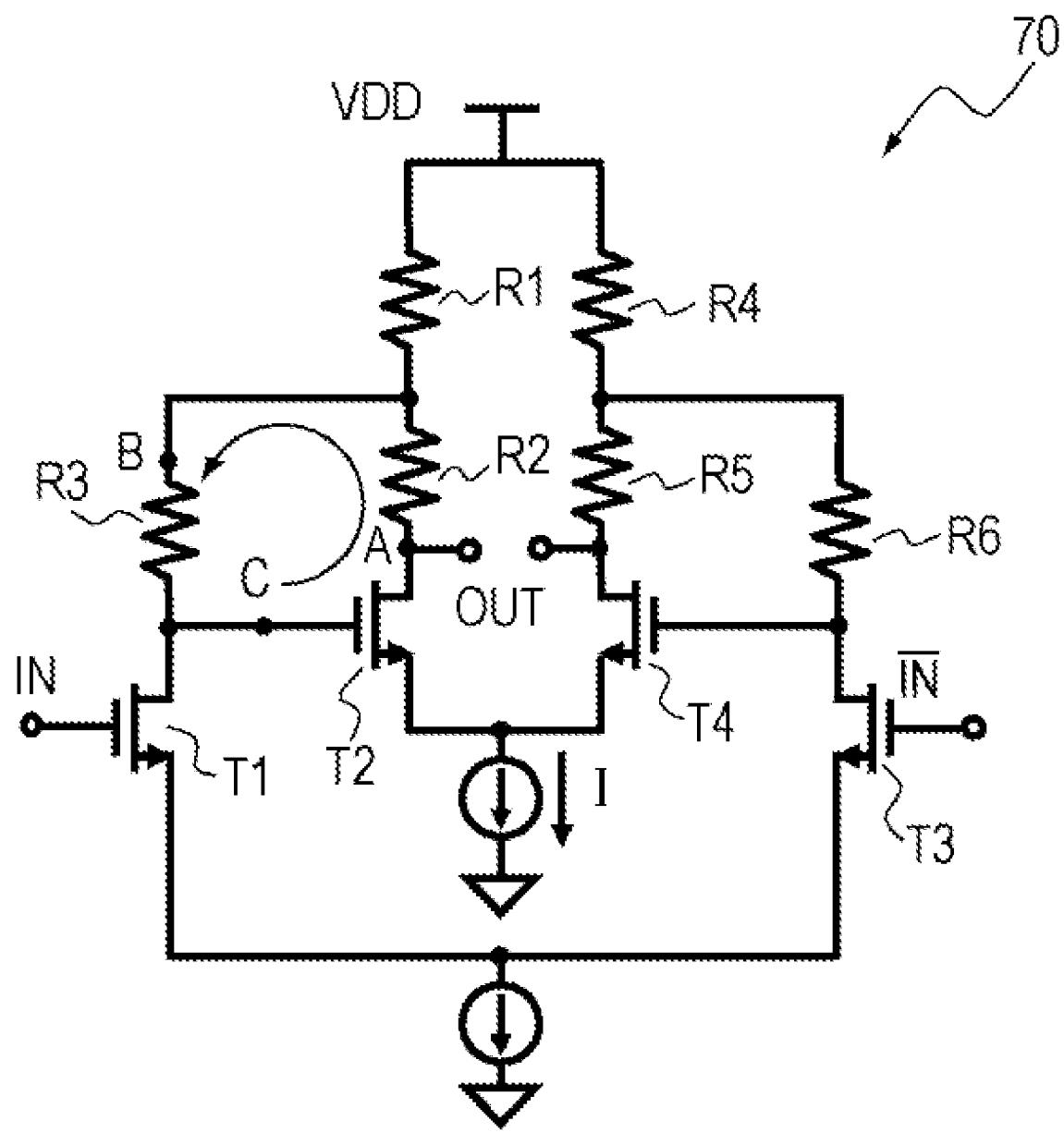
FIG. 7 illustrates an amplifier circuit according to a related art.
Figure 8:
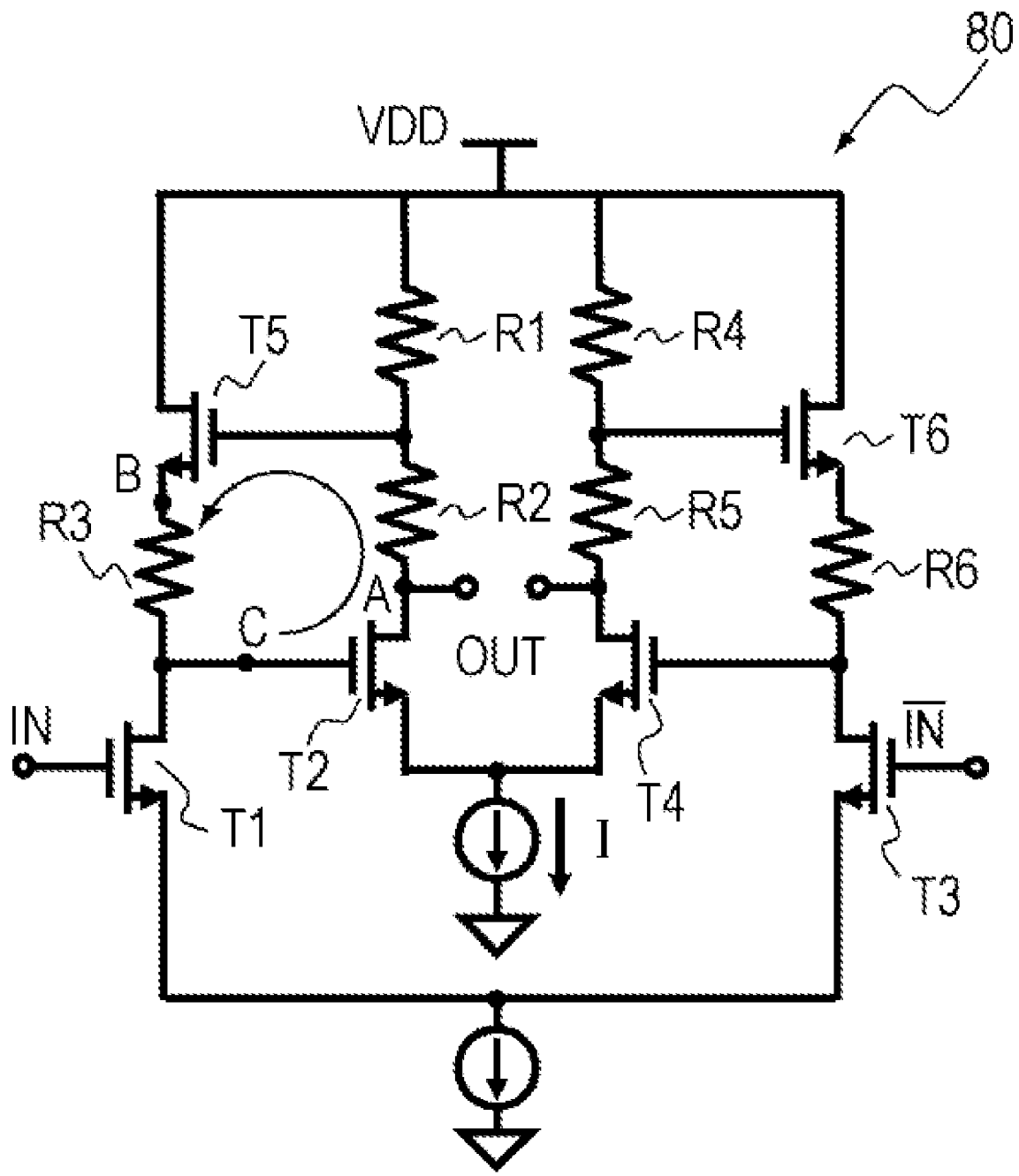
FIG. 8 illustrates an amplifier circuit according to another related art.

On the other hand, FIG. 6 illustrates a modification of the amplifier circuit according to the third embodiment. The amplifier circuit illustrated in FIG. 6 has the same circuit configuration as that of the amplifier circuit illustrated in FIG. 5 except that transistors T27 and T28 are provided. The transistors T27 and T28 are bipolar transistors.

In the configuration, a normal drive signal may be supplied to the optical modulator without affecting the base voltages of the amplifiers in the last stage by applying base voltages satisfying the condition of the above-described expressions, even when the current value of the current source I1 is adjusted.

In the amplifier circuits according to the above-described embodiments, even when the output level of the amplifier circuit is adjusted, the second-stage amplifiers may be normally operated and a stable output may be supplied from the amplifier circuit without affecting the input of the second-stage amplifiers. Accordingly, an output at an amplitude level corresponding to the optical modulator connected to the amplifier circuit of the present invention may be supplied.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An amplifier circuit comprising:
a first amplifier to amplify an input signal and to output a first amplified signal;
a second amplifier to amplify the first amplified signal and to output a second amplified signal; and
a feedback circuitry to feed back the second amplified signal to the input of the second amplifier; wherein,
the feedback circuitry includes a transistor that receives at least part of the second amplified signal at a drain or collector and a resistor coupled between an emitter/source and the input of the second amplifier,
a gate voltage that is different than the second amplified signal is applied to a gate of the transistor, and
the transistor and the resistor keep the input level of the second amplifier constant by a source voltage or an emitter voltage obtained by applying a gate bias signal or a base bias signal.

2. The amplifier circuit according to claim 1, wherein
the first amplifier and the second amplifier are source-grounded transistors,
the transistor in the feedback circuitry is a source follower transistor, and
a gate level of the transistor is controlled based on the input level of the second amplifier and a level of the second amplified signal.

3. The amplifier circuit according to claim 1, wherein,
the first amplifier and the second amplifier are emitter-grounded amplifiers,
the transistor in the feedback circuitry is an emitter follower transistor, and
a base level of the transistor in the feedback circuitry is controlled based on the input level of the second amplifier and a level of the second amplified signal.

* * * * *